United States Patent
Salcedo et al.

(10) Patent No.: US 6,424,197 B1
(45) Date of Patent: Jul. 23, 2002

(54) RISING AND FALLING EDGE APERTURE DELAY CONTROL CIRCUIT IN ANALOG FRONT END OF IMAGING SYSTEM

(75) Inventors: J. Antonio Salcedo, Livermore; Charles Rogers, San Jose; Raphael Horton, Pleasanton, all of CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/695,897

(22) Filed: Oct. 24, 2000

(51) Int. Cl.[7] ............................................... H03H 11/26
(52) U.S. Cl. ...................... 327/276; 327/175; 327/291; 327/298
(58) Field of Search .............................. 327/172, 173, 327/174, 175, 176, 269, 270, 271, 276, 277, 291, 298

(56) References Cited

U.S. PATENT DOCUMENTS

| | | | |
|---|---|---|---|
| 4,737,670 A | * 4/1988 | Chan | 327/278 |
| 5,008,563 A | 4/1991 | Kenney et al. | 327/172 |
| 5,438,550 A | * 8/1995 | Kim | 327/175 |
| 5,465,062 A | * 11/1995 | Fong | 327/172 |
| 5,550,514 A | * 8/1996 | Liedberg | 327/276 |
| 5,589,788 A | 12/1996 | Goto | 327/276 |
| 5,638,016 A | * 6/1997 | Eitrheim | 327/175 |
| 5,952,868 A | * 9/1999 | Gowni et al. | 327/262 |

* cited by examiner

*Primary Examiner*—Timothy P. Callahan
*Assistant Examiner*—An T. Luu
(74) *Attorney, Agent, or Firm*—Townsend and Townsend and Crew LLP

(57) ABSTRACT

A programmable delay in an AFE of an imaging system which can vary both the pulse position and the pulse width. The pulse width and position are controlled by providing separate programmable delay circuits for the rising and falling edges of the desired timing signal. Combining logic then combines the outputs of the two delay circuits to produce an output clock with separately delayed rising and falling edges.

3 Claims, 10 Drawing Sheets

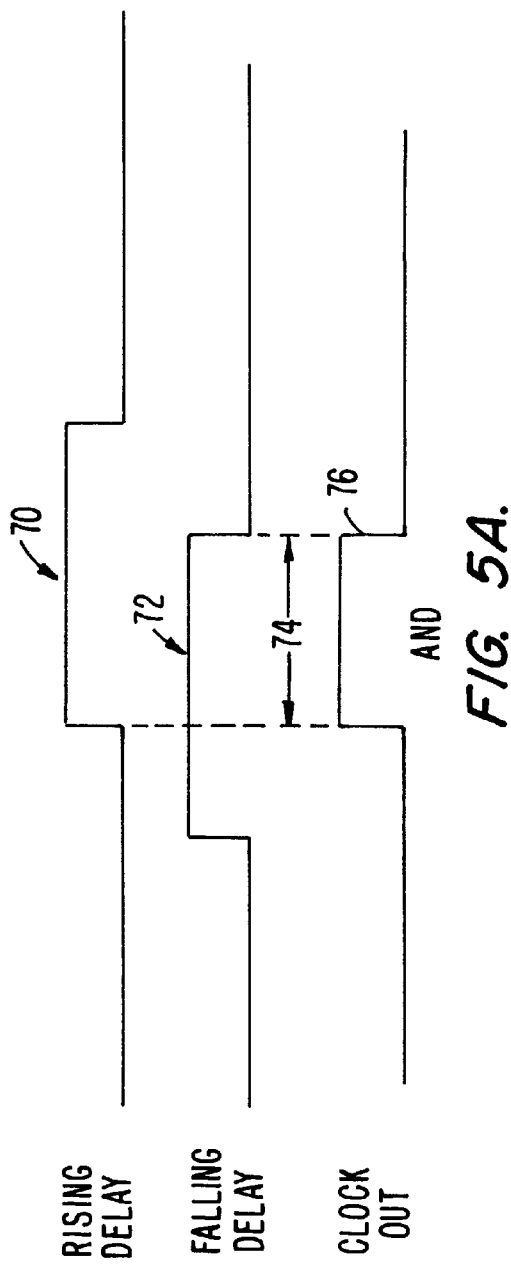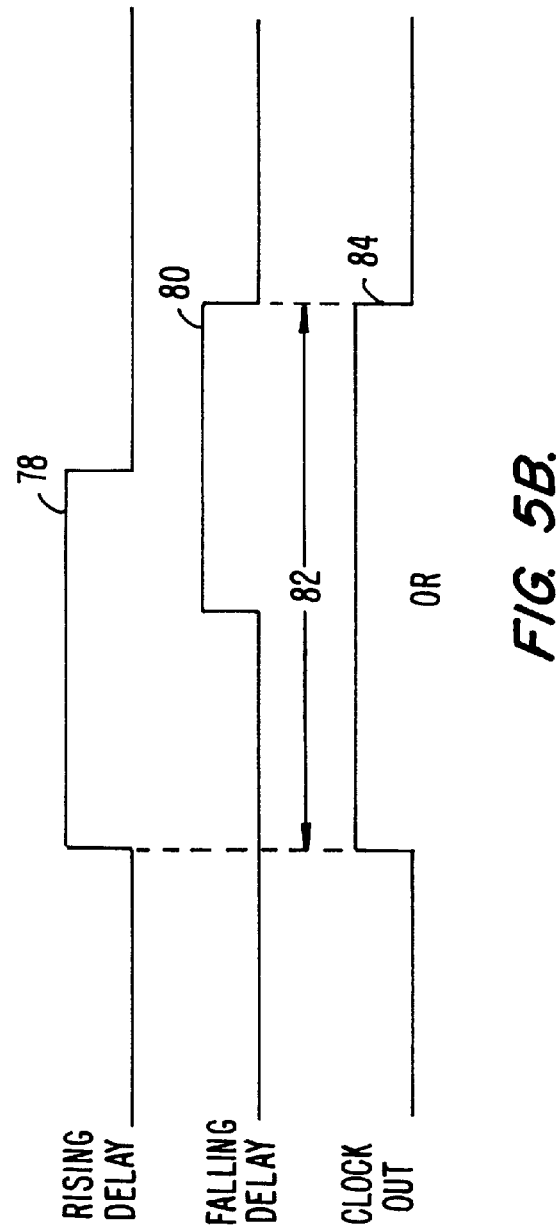

RISING AND FALLING EDGE APERTURE DELAY CONTROL CIRCUIT IN ANALOG FRONT END OF IMAGING SYSTEM

BACKGROUND OF THE INVENTION

The present invention relates to the delay of timing signals in an integrated circuit, and in particular for an analog front end (AFE) chip.

A typical imaging system has the elements shown in FIG. 1. A charged coupled device (CCD) chip 12 provides an analog CCD output on line 14 under the control of timing signals on lines 16 from a timing generator chip 18. The timing generator also provides timing signals on lines 20 to AFE chip 22. Chip 22 digitizes the data, and provides a digital data output on lines 24 to a digital signal processing (DSP) chip 26. DSP chip 26 provides control signals on lines 28 to AFE 22.

The AFE amplifies and digitizes the CCD analog output signal. The DSP is used to process the digitized CCD data into an image.

The timing signals on lines 20 for the AFE usually consist of three signals, as illustrated in FIG. 2: SPIX, SBLK and ADCCLOCK. The SPIX samples the video signal. The SBLK samples the black signal which is used to establish a calibration reference. The ADCCLOCK is used to time the digitization in the AFE.

It is desirable to be able to optimize the placement of these timing signals shown in FIG. 2. In particular, there are many different CCD chips and AFE chips in the marketplace with different characteristics.

In an existing product marketed by the assignee of the present application, Exar's AFE chip 9855 provides a programmable delay in the AFE chip. The delay is programmed using the serial port control lines 28 shown in FIG. 1. However, this delay merely allows the signals to be delayed with their existing pulse widths, and does not allow the pulse width to be varied.

In other technology areas, pulses can be varied in both position and width. Examples are set forth in U.S. Pat. Nos. 5,008,563 and 5,589,788.

SUMMARY OF THE INVENTION

The present invention provides a programmable delay in an AFE of an imaging system which can vary both the pulse position and the pulse width. The pulse width and position are controlled by providing separate programmable delay circuits for the rising and falling edges of the desired timing signal. Combining logic then combines the outputs of the two delay circuits to produce an output clock with separately delayed rising and falling edges.

In a preferred embodiment, the delay circuits each have a number of taps providing different delayed versions of the pulse. Multiplexer circuits allow the selection of the desired delay for both delay circuits. A comparison circuit compares the programmed rising and falling edges. The invention provides a simple logic implementation for the delayed tap structure. The delayed pulses can simply be combined in one of two manners depending on whether the rising edge delay desired is greater or less than the desired falling edge delay. If the rising edge delay is greater than the falling edge delay, an AND function is selected in the combining logic. On the other hand, if the rising edge delay is less than the falling edge delay, an OR function is selected in the combining circuit. The selection is done automatically in response to the programmed rising and falling edge delays as selected by the DSP serial input.

For a further understanding of the nature and advantages of the invention, reference should be made to the following description taken in conjunction with the accompanying drawings.

BRIEF DESCRIPTION OF THE DRAWINGS

FIGS. 5A and 5B are timing diagrams illustrating the delay patterns resulting in the AND and OR configurations of the combining logic of FIG. 4.

DESCRIPTION OF THE SPECIFIC EMBODIMENTS

Figure 1:
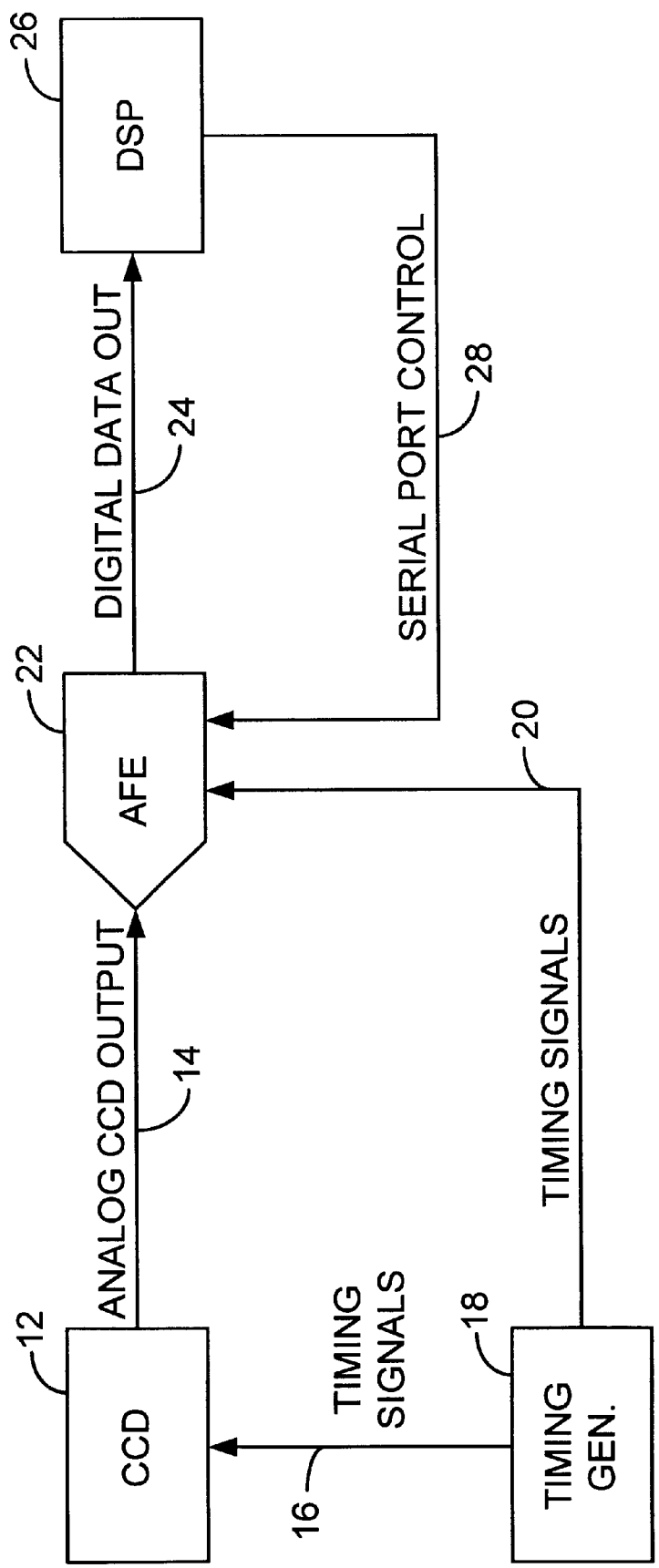
FIG. 1 is a block diagram of a prior art imaging system.
Figure 2:
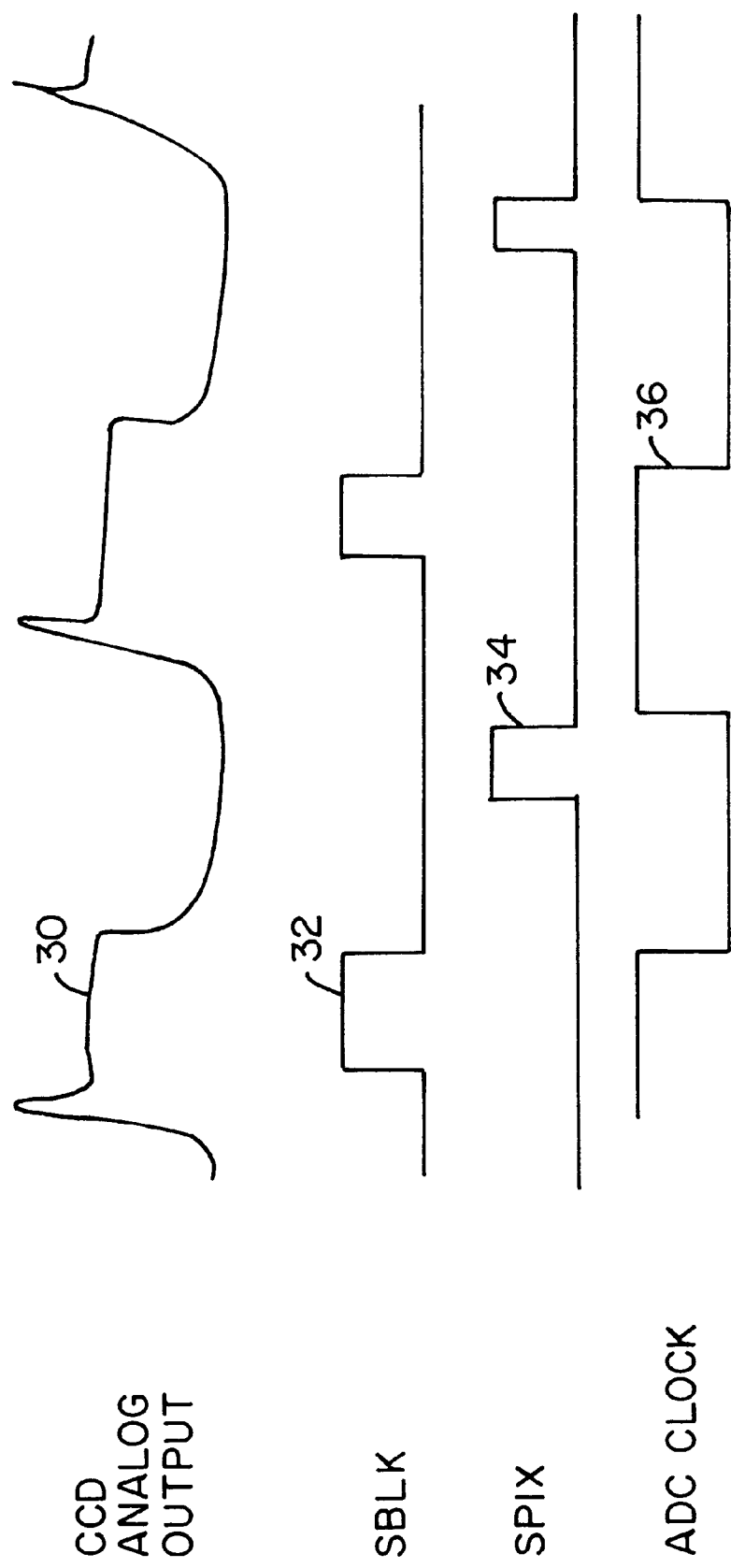
FIG. 2 is a timing diagram illustrating the timing signals provided to the AFE of FIG. 1.
Figure 3:
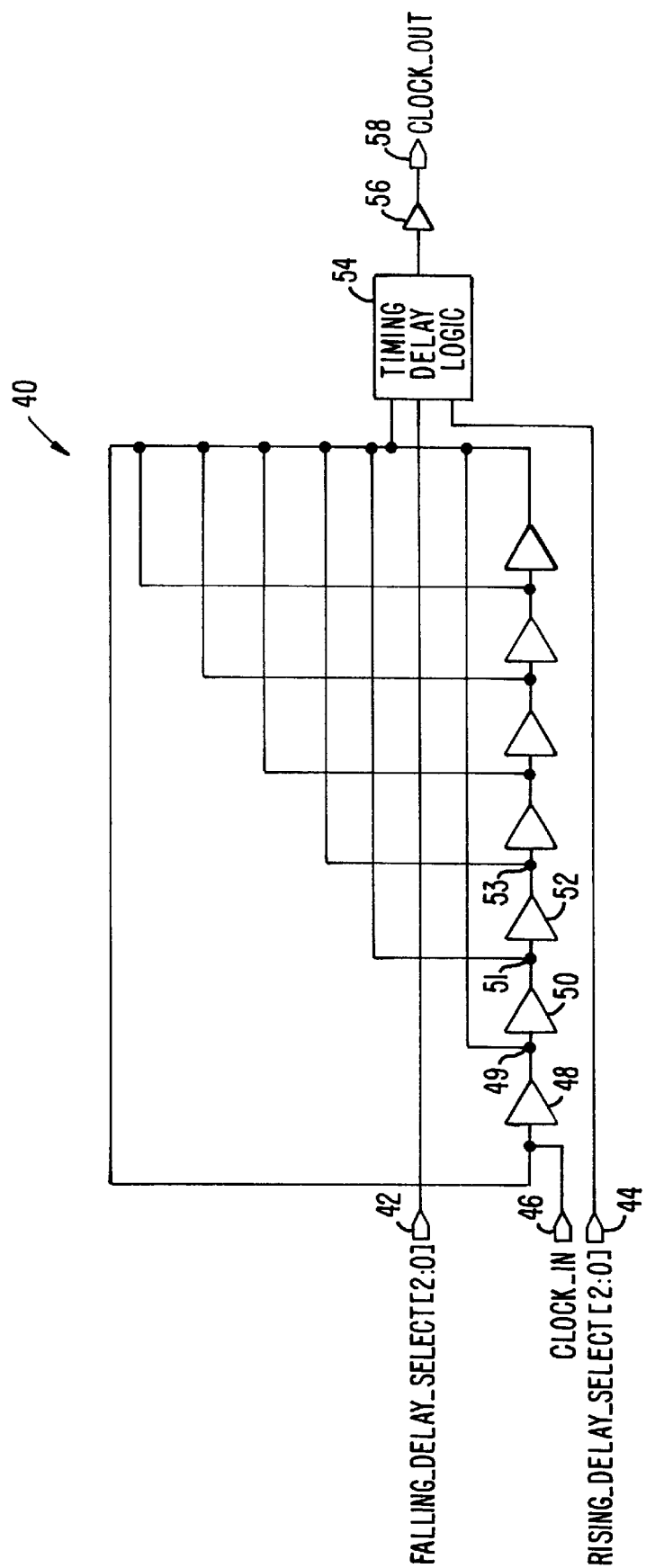
FIG. 3 is a block diagram of a delay circuit in the AFE according to an embodiment of the present invention.

FIG. 3 is a block diagram of an aperture delay control circuit 40 according to an embodiment of the invention. A falling edge delay select input 42 and a rising edge delay select input 44 provide the control signals for programming the delays from the DSP of FIG. 1 on the serial port. A clock input 46 provides the timing signals from the external timing generator. The clock is provided through a number of delay elements 48, 50, 52, etc. In between each of the delay elements are taps 49, 51, 53, etc. Each of these taps provides a different clock signal, identified as clock (1), clock (2), clock (3), etc. The delayed clock signals are then provided to delay combining logic block 54. The output of this block is provided through a buffer 56 to an output port 58. The signals on port 58 are used internally in the AFE to time the events illustrated in FIG. 2.

Figure 4:
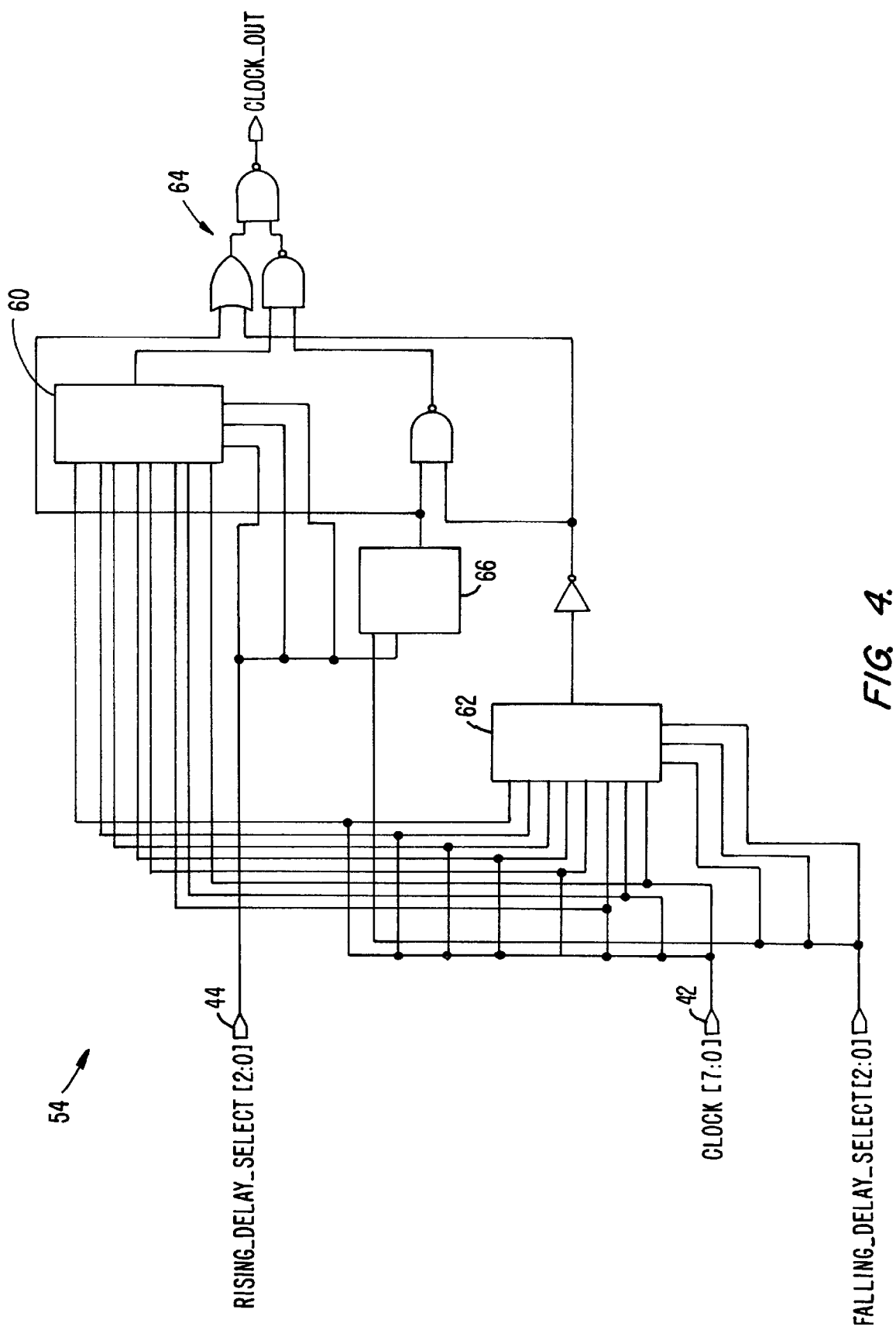
FIG. 4 is a block diagram of the delay combining logic of FIG. 3.

A block diagram of the delay combining circuit 54 of FIG. 3 is illustrated in FIG. 4. The various delayed clocks from the different taps of the delay circuit are provided to a first multiplexer 60 for the rising edge delay, and a second multiplexer 62 for the falling edge delay. The outputs of these two multiplexers are provided to combinational logic 64. As can be seen, the falling edge delay select inputs on line 42 are provided both to multiplexer 62 and to a comparison circuit 66. Similarly, the rising edge delay control signals on lines 44 are provided to multiplexer 60 and to comparison circuit 66.

Comparison circuit 66 compares the two delays and sends appropriate control signals to combinational logic 64. FIGS. 5A and 5B are timing diagrams illustrating the operation of comparison circuit 66 of FIG. 4. In FIG. 5A, more of a delay has been programmed for rising pulse 70 compared to falling pulse 72. The desired width between the rising edge of the rising pulse and the falling edge of the falling pulse is illustrated by arrow 74. As can be seen, providing a clock out pulse 76 with these characteristics can be done by an AND function of the rising delay and falling delay signals.

On the other hand, in FIG. 5B, if the rising edge pulse 78 has less delay than the falling edge pulse 80, the desired pulse width between arrows 82 will not be produced by an AND function. Rather, an OR function is required to produce the desired output pulse 84.

Accordingly, comparison circuit 66 of FIG. 4 compares the programmed rising and falling delays and appropriately selects either an AND function or an OR function for logic block 64.

Figure 6:
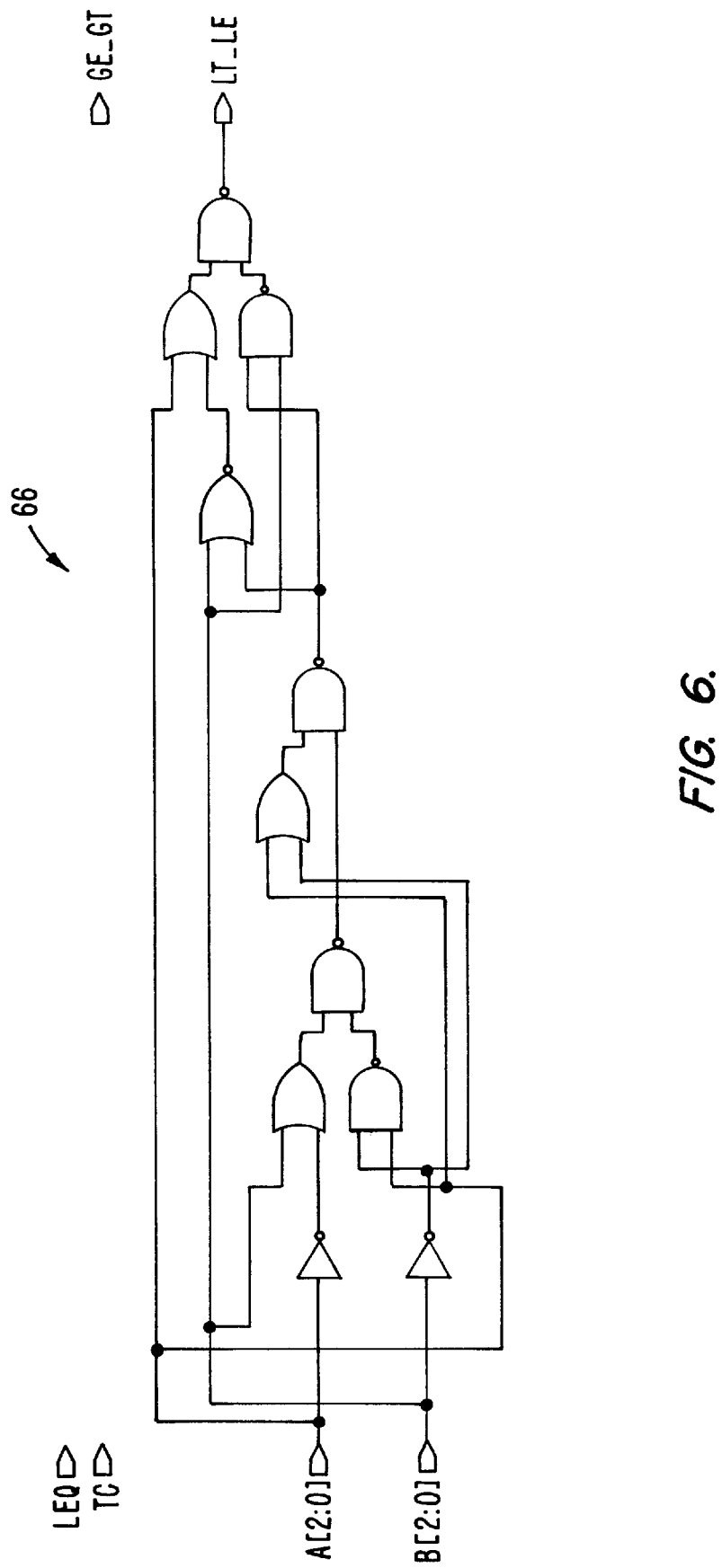
FIG. 6 is a block diagram of the comparison logic of FIG. 4.

A block diagram of the logic used in one embodiment of comparison circuit 66 of FIG. 4 is shown in FIG. 6.

Figure 7:
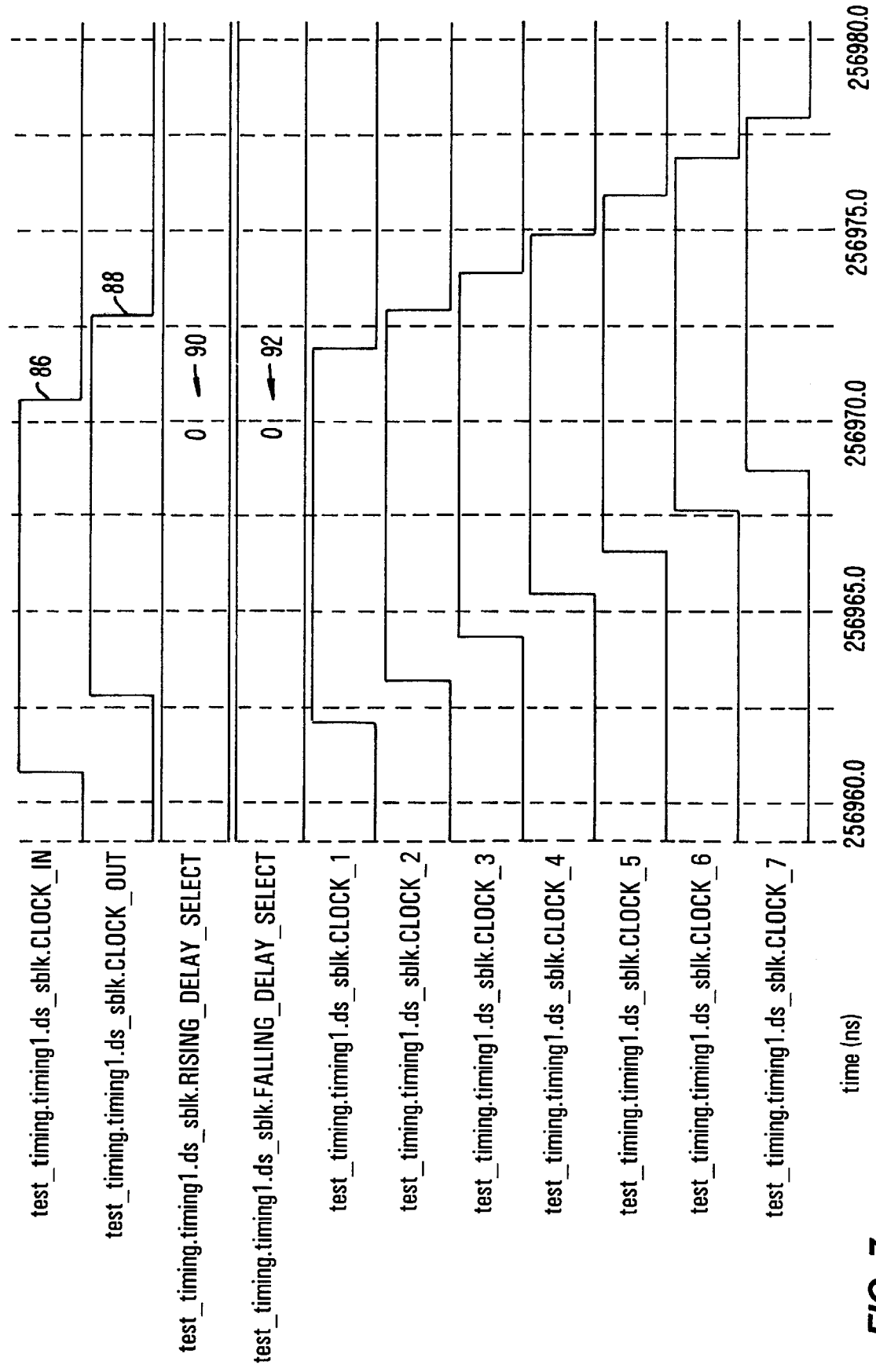
FIGS. 7–10 are timing diagrams illustrating different control inputs and resulting different clock outputs utilizing the present invention.

FIGS. 7–10 illustrate different examples of programmed delays resulting from different programming inputs. In FIG. 7, an input clock pulse 86 is shown which results in an output clock pulse 88. This output delay is caused by programming values of zero for the rising edge delay shown in row 90 and also a value of zero for the falling edge delay shown in row 92. Thus, this figure illustrates that there is some delay even with a programmed value of zero.

Figure 8:
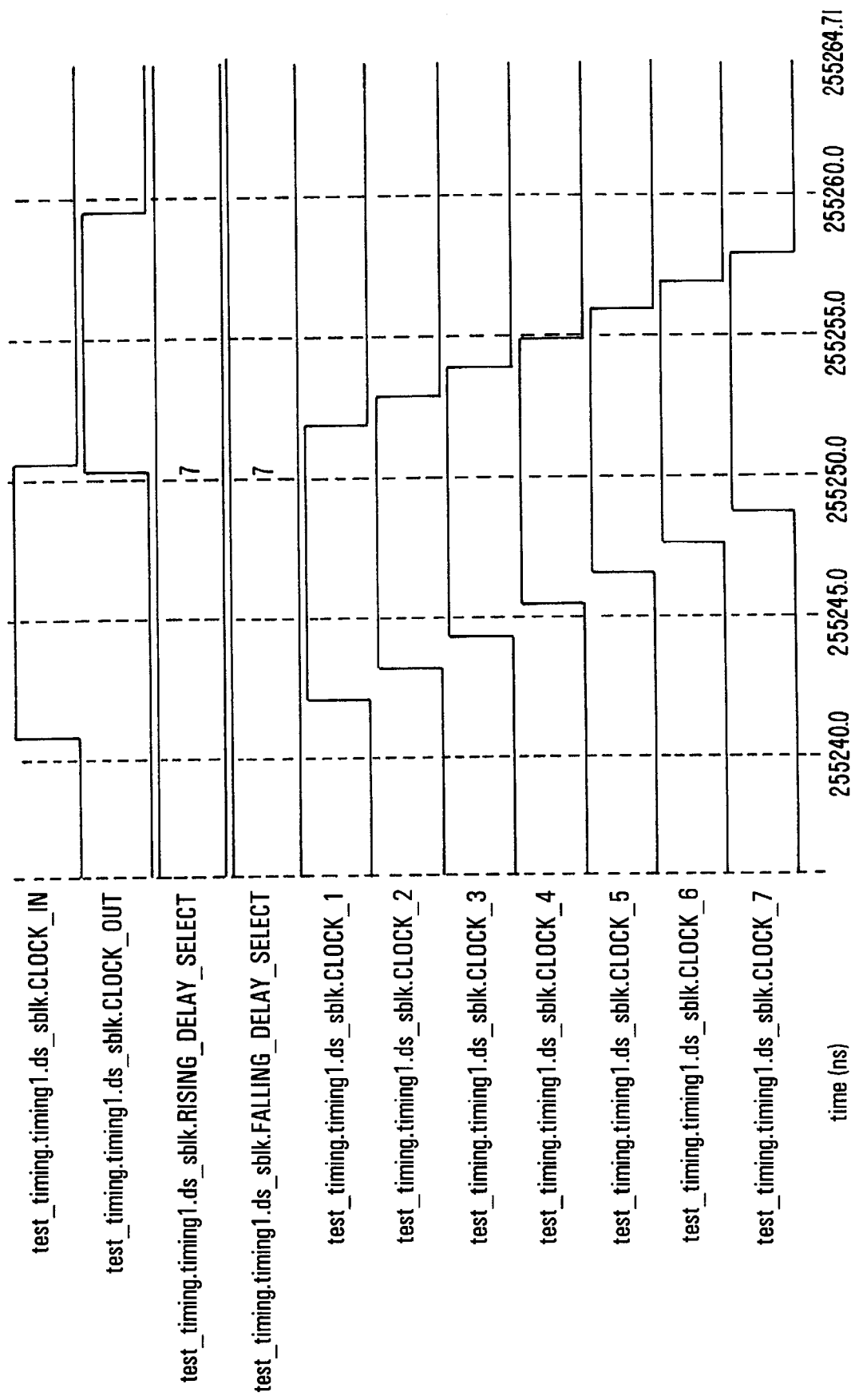

FIG. 8 illustrates a program value of 7 for each of the rising and falling edge delays, with the corresponding more extended delay of the output pulse in FIG. 8 compared to FIG. 7.

Figure 9:
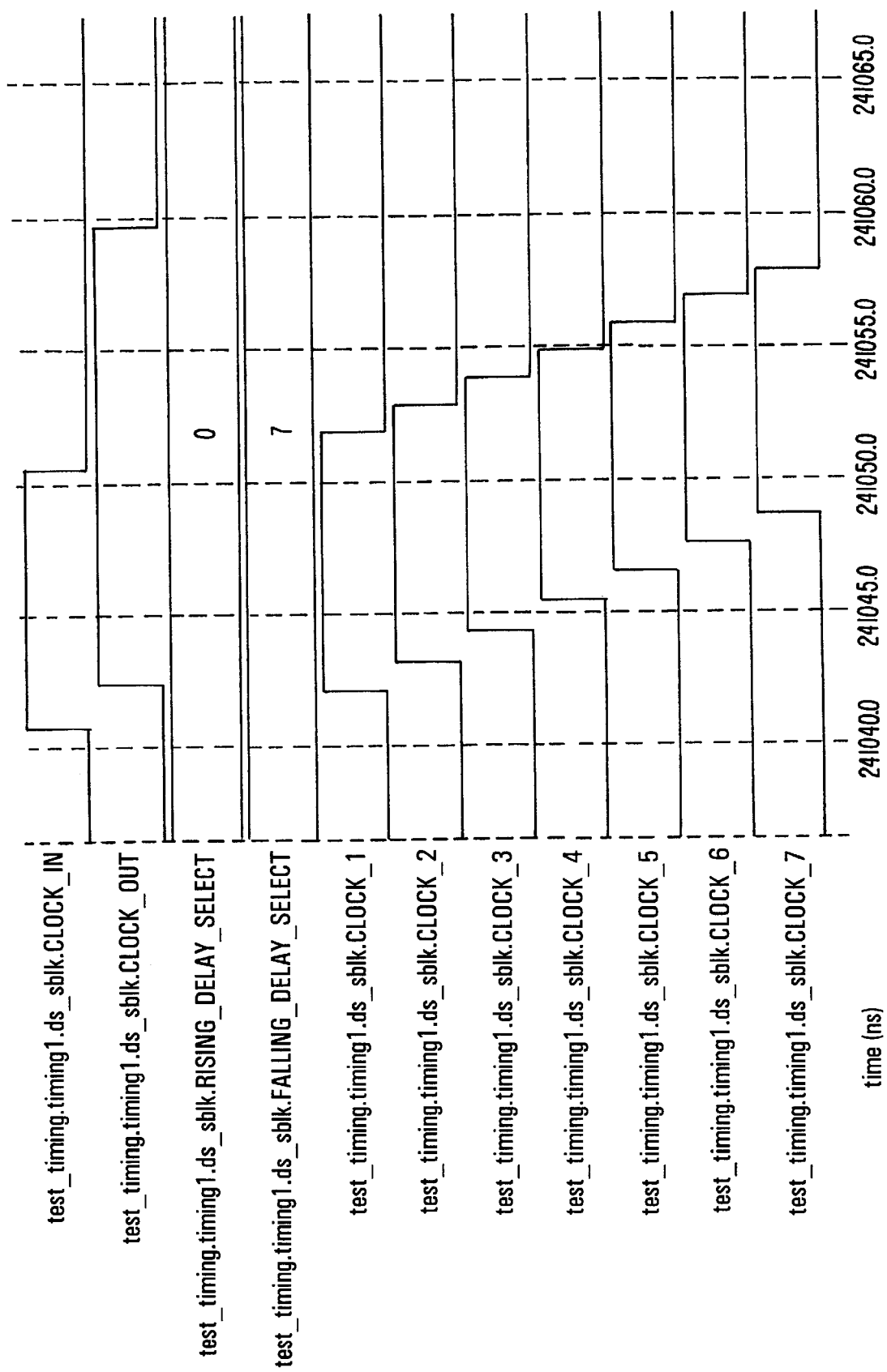

FIG. 9 illustrates the falling edge delay by a value of 7, with no delay for the rising edge. As can be seen, this results in an output pulse with its rising edge having a similar delay to FIG. 7, but with a much wider pulse width.

Figure 10:
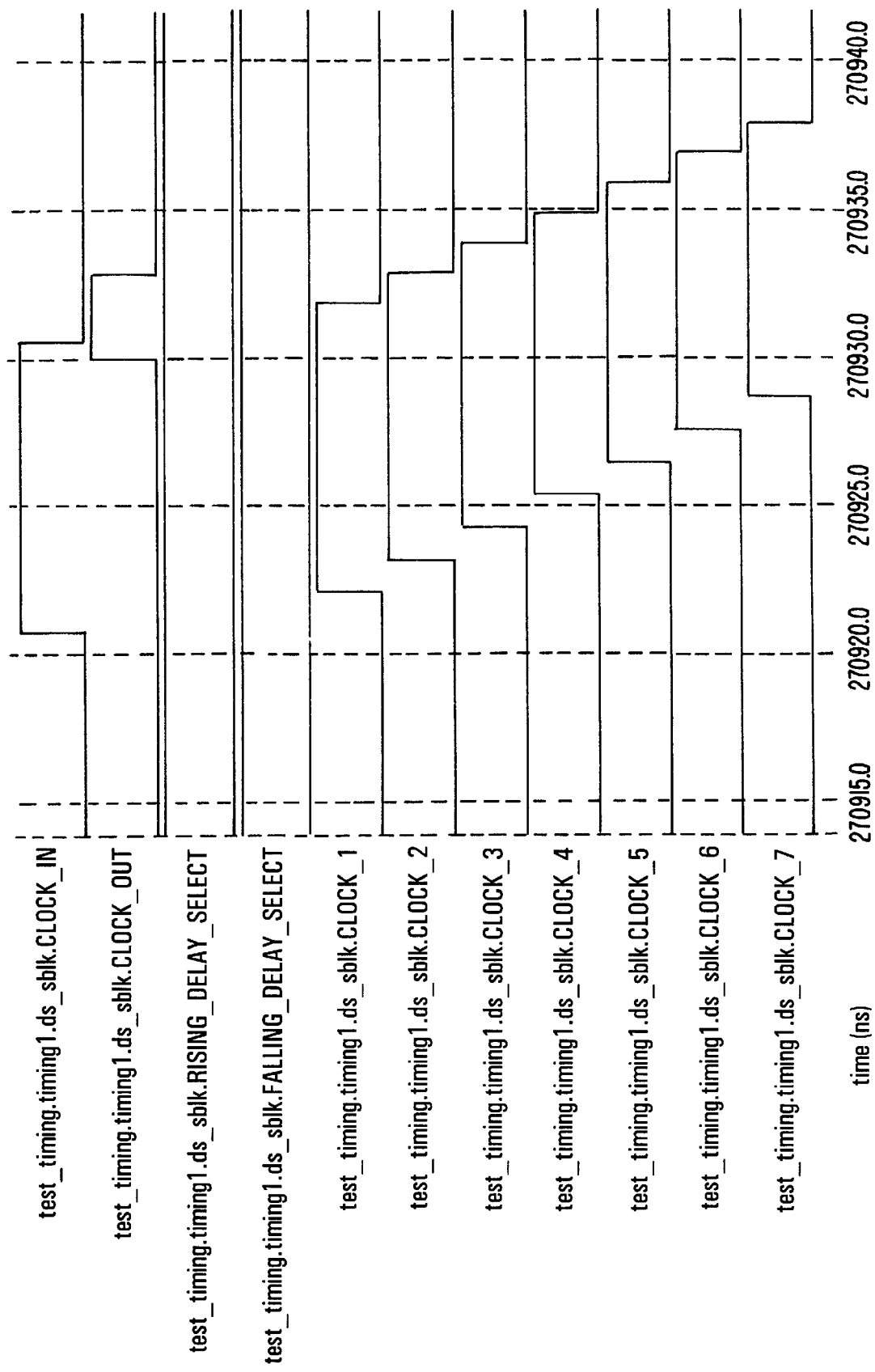

FIG. 10 illustrates the rising edge delay by a value of 7, and no delay for the falling edge. As can be seen, this results in a long delay for the rising edge and a narrow pulse width.

The present invention provides an AFE which allows systems to be designed with a simple timing generator (TG) chip. The TG doesn't need to be higher frequency or programmable. In addition, the present invention allows increased flexibility since the AFE can work with many TG chips and CCD chips. In addition, using the present invention allows the DSP to control timing independent of the TG and allows adjustment for CCD variations.

As will be understood by those of skill in the art, the present invention may be embodied in other specific forms without departing from the essential characteristics of the invention. For example, other logic could be used to produce the comparison results of circuit 66, and other logic could be used to implement logic block 64. Additionally, rather than multiplexers with delayed clock pulses, the pulses could be generated from an indication of the timed delay. Additionally, the delay could be achieved by delay elements, inverters, or any other delay circuitry. Instead of a CCD chip, the invention could connect to a CMOS, CIS, or any other type of imaging chip. Accordingly, the foregoing description is intended to be illustrative, but not limiting, of the scope of the invention which is set forth in the following claims.

What is claimed is:

1. An analog front end semiconductor chip for processing signals from an image sensor semiconductor chip in response to externally generated timing signals, comprising:
   a clock input for receiving one of said externally generated timing signals;
   a first programmable delay circuit coupled to said clock input for delaying a rising edge of a first timing signal by a first amount;
   a second programmable delay circuit coupled to said clock input for delaying a falling edge of said first timing signal by a second amount;
   combining logic coupled to said first and second delay circuits for producing an output clock having a rising edge that is delayed by said first amount, and having a falling edge that is delayed by said second amount, wherein said first and second amounts can be different; and
   a comparison circuit for comparing a programmed rising edge delay to a programmed falling edge delay, and
      (i) if said rising edge delay is greater than said falling edge delay, for providing a control signal to said combining logic to cause said combining logic to perform an AND function of timing pulses from said first and second delay circuits, and
      (ii) if said rising edge delay is less than said falling edge delay, for providing a control signal to said combining logic to cause said combining logic to perform an OR function of timing pulses from said first and second delay circuits.

2. An analog front end semiconductor chip for processing signals from an image sensor semiconductor chip in response to externally generated timing signals, comprising:
   a clock input for receiving one of said externally generated timing signals;
   a first programmable delay circuit coupled to said clock input for delaying a first timing signal a plurality of delay amounts at a plurality of taps;
   a second programmable delay circuit coupled to said clock input for delaying said first timing signal a plurality of delay amounts at a plurality of taps;
   a first multiplexer for selecting between said plurality of taps of said first delay circuit according to an input desired rising edge delay
   a second multiplexer for selecting between said plurality of taps of said second delay circuit according to an input desired falling edge delay;
   a comparison circuit for comparing a programmed rising edge delay to a programmed falling edge delay, and
      (i) if said rising edge delay is greater than said falling edge delay, for providing a control signal to said combining logic to cause said combining logic to perform an AND function of timing pulses from said first and second delay circuits, and
      (ii) if said rising edge delay is less than said falling edge delay, for providing a control signal to said combining logic to cause said combining logic to perform an OR function of timing pulses from said first and second delay circuits; and
   combining logic coupled to outputs of said first and second multiplexers for producing an output clock having a rising edge that is delayed by said first amount, and having a falling edge that is delayed by said second amount, wherein said first and second amounts can be different.

3. An analog front end semiconductor chip for processing signals from an image sensor semiconductor chip in response to externally generated timing signals, comprising:
   a clock input for receiving one of said externally generated timing signals;
   a first programmable delay circuit coupled to said clock input for delaying a rising edge of a first timing signal by a first amount;
   a second programmable delay circuit coupled to said clock input for delaying a falling edge of said first timing signal by a second amount;
   combining logic coupled to said first and second delay circuits for producing an output clock having a rising edge that is delayed by said first amount, and having a falling edge that is delayed by said second amount, wherein said first and second amounts can be different;
   a first input having a rising edge delay;
   a second input having a falling edge delay; and an output that combines said first and second inputs, wherein
  (i) if said rising edge delay is greater than said falling edge delay, said combining logic performs an AND function of timing pulses from said first and second programmable delay circuits, and
  (ii) if said rising edge delay is less than said falling edge delay, said combining logic performs an OR function of timing pulses from said first and second programmable delay circuits.

\* \* \* \* \*